United States Patent
Kim et al.

(10) Patent No.: US 12,406,967 B2
(45) Date of Patent: Sep. 2, 2025

(54) STRETCHABLE DISPLAY DEVICE WITH CONNECTION LINES IN DIFFERENT DIRECTIONS BETWEEN PIXELS

(71) Applicant: LG Display Co., Ltd., Seoul (KR)

(72) Inventors: Aesun Kim, Seoul (KR); Hyunju Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 515 days.

(21) Appl. No.: 17/516,310

(22) Filed: Nov. 1, 2021

(65) Prior Publication Data

US 2022/0139888 A1  May 5, 2022

(30) Foreign Application Priority Data

Nov. 2, 2020 (KR) .......... 10-2020-0144678

(51) Int. Cl.
*H01L 25/075* (2006.01)
*G09G 3/00* (2006.01)
(Continued)

(52) U.S. Cl.
CPC ......... *H01L 25/0753* (2013.01); *G09G 3/035* (2020.08); *G09G 3/20* (2013.01);
(Continued)

(58) Field of Classification Search
CPC . H01L 25/0753; H01L 23/5387; H01L 33/62; H01L 23/5386; H01L 27/124;
(Continued)

(56) References Cited

U.S. PATENT DOCUMENTS 9,691,996 B2   6/2017  Lee
2005/0231580 A1*  10/2005  Yamazaki ............... B41J 2/45
                                                       347/130
(Continued)

FOREIGN PATENT DOCUMENTS

KR  10-2016-0101825 A  8/2016
KR  10-2020-0081220 A  7/2020

OTHER PUBLICATIONS

IP.com npl search (Year: 2024).*

*Primary Examiner* — William B Partridge
*Assistant Examiner* — David Paul Sedorook
(74) *Attorney, Agent, or Firm* — Seed Intellectual Property Law Group LLP

(57) ABSTRACT

According to an aspect of the present disclosure, the display device includes a stretchable lower substrate and a plurality of first substrates disposed on the lower substrate and including a first pixel and a second pixel. The display device also includes a plurality of second substrates configured to couple first substrates adjacent to each other among the plurality of first substrates. The display device further includes a plurality of connection lines disposed on the plurality of second substrates and configured to couple the first pixel and the second pixel. The plurality of connection lines includes a plurality of first connection lines extended in a first direction, a plurality of second connection lines extended in a second direction and a plurality of third connection lines extended in a third direction. Thus, the display device may be improved in resolution and may be uniformly stretched in all directions.

16 Claims, 9 Drawing Sheets

(51) Int. Cl.
*G09G 3/20*  (2006.01)
*H01L 23/538*  (2006.01)
*H10H 20/857*  (2025.01)

(52) U.S. Cl.
CPC ....... *H01L 23/5387* (2013.01); *H10H 20/857* (2025.01); *G09G 2300/0426* (2013.01); *G09G 2300/0842* (2013.01); *G09G 2310/08* (2013.01)

(58) Field of Classification Search
CPC ............. H01L 27/1255; H01L 27/1214; H01L 27/3276; H01L 27/3244; G09G 3/035; G09G 3/20; G09G 2300/0426; G09G 2300/0842; G09G 2310/08; G09G 2320/0223; G09G 3/32; H10K 59/10; H10K 59/12; H10K 59/131; H10H 20/857; H10H 29/142; G09F 9/301; H10D 86/441; H10D 86/481
See application file for complete search history.

(56) References Cited

U.S. PATENT DOCUMENTS

| | | | |
|---|---|---|---|
| 2016/0095172 A1* | 3/2016 | Lee ...................... | H10K 77/111 |
| | | | 313/504 |
| 2018/0046221 A1* | 2/2018 | Choi ..................... | H05B 33/22 |
| 2019/0326553 A1* | 10/2019 | Abe ..................... | H10K 50/844 |
| 2020/0266323 A1* | 8/2020 | Nishizaki ............. | H10K 50/858 |
| 2021/0193774 A1* | 6/2021 | Won ..................... | H10K 59/131 |
| 2021/0217995 A1* | 7/2021 | Wang ................... | H10K 59/12 |
| 2021/0375835 A1* | 12/2021 | Kang ................... | H01L 23/5387 |
| 2022/0068218 A1* | 3/2022 | Kwak ................... | H10K 59/121 |
| 2022/0320241 A1* | 10/2022 | Zhou .................... | H10K 59/131 |

* cited by examiner

STRETCHABLE DISPLAY DEVICE WITH CONNECTION LINES IN DIFFERENT DIRECTIONS BETWEEN PIXELS

CROSS-REFERENCE TO RELATED APPLICATIONS

This application claims the priority of Korean Patent Application No. 10-2020-0144678 filed on Nov. 2, 2020, in the Korean Intellectual Property Office, the disclosure of which is incorporated herein by reference.

BACKGROUND

Technical Field

The present disclosure relates to a display device, and more particularly, to a display device in which connection lines may be disposed in various ways.

Description of the Related Art

Display devices employed by the monitor of a computer, a TV, a mobile phone or the like include an organic light emitting display (OLED) that emits light by itself, and a liquid crystal display (LCD) that requires a separate light source.

As the display devices have been increasingly applied to diverse fields such as a computer monitor, a TV, and a personal mobile device, display devices having a large active area and a reduced volume and weight have been studied.

Further, recently, a display device in which display elements, lines, etc., are formed on a flexible substrate made of flexible plastic and which may be stretched in a specific direction and manufactured in various shapes has attracted attention as a next-generation display device.

BRIEF SUMMARY

One or more embodiments of the present disclosure provide a display device capable of reducing a stress concentrated in an outer area of a rigid substrate.

Additional embodiments of the present disclosure provide a display device in which a greater number of connection lines may be secured.

Further embodiments of the present disclosure provide a display device in which the number of pixels formed in a single rigid substrate may be increased.

The technical benefits of the present disclosure are not limited to the above-mentioned benefits, and other benefits, which are not mentioned above, can be clearly understood by those skilled in the art from the following descriptions.

According to an aspect of the present disclosure, the display device includes a stretchable lower substrate and a plurality of first substrates disposed on the lower substrate and including a first pixel and a second pixel. The display device also includes a plurality of second substrates configured to connect first substrates adjacent to each other among the plurality of first substrates. The display device further includes a plurality of connection lines disposed on the plurality of second substrates and configured to connect the first pixel and the second pixel. The plurality of connection lines includes a plurality of first connection lines extended in a first direction, a plurality of second connection lines extended in a second direction and a plurality of third connection lines extended in a third direction. Thus, the display device may be improved in resolution and may be uniformly stretched in all directions.

According to another aspect of the present disclosure, the display device includes a ductile substrate and a plurality of rigid substrates disposed on the ductile substrate. The display device also includes a plurality of pixels formed on each of the plurality of rigid substrates, and a plurality of connection lines disposed between the plurality of rigid substrates and connected to the plurality of pixels. The plurality of connection lines may be extended in at least three directions.

Other detailed matters of the embodiments are included in the detailed description and the drawings.

According to the present disclosure, when a display device is repeatedly stretched, components are not damaged. Thus, the stretching reliability can be improved.

According to the present disclosure, a greater number of connection lines can be secured and can be disposed in various ways. Thus, uniform stretching in all directions can be achieved.

According to the present disclosure, the number of pixels formed in a single rigid substrate can be increased. Thus, the display device can be improved in resolution.

The effects according to the present disclosure are not limited to the contents exemplified above, and more various effects are included in the present specification

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Display Device

A display device is capable of displaying an image even when bent or stretched and may be referred to as a stretchable display device. The display device may have higher flexibility than conventional typical display devices and may have stretchability. Thus, a user may bend or stretch the display device, and the shape of the display device may be freely changed in response to a manipulation of the user. For example, when the user pulls on an edge of the display device, the display device may be stretched in a direction of being pulled by the user. When the user places the display device on a non-flat external surface, the display device may be bent along the shape of the external surface of a wall surface. Also, when force applied by the user is removed, the display device may be restored to its original shape.

Figure 1:
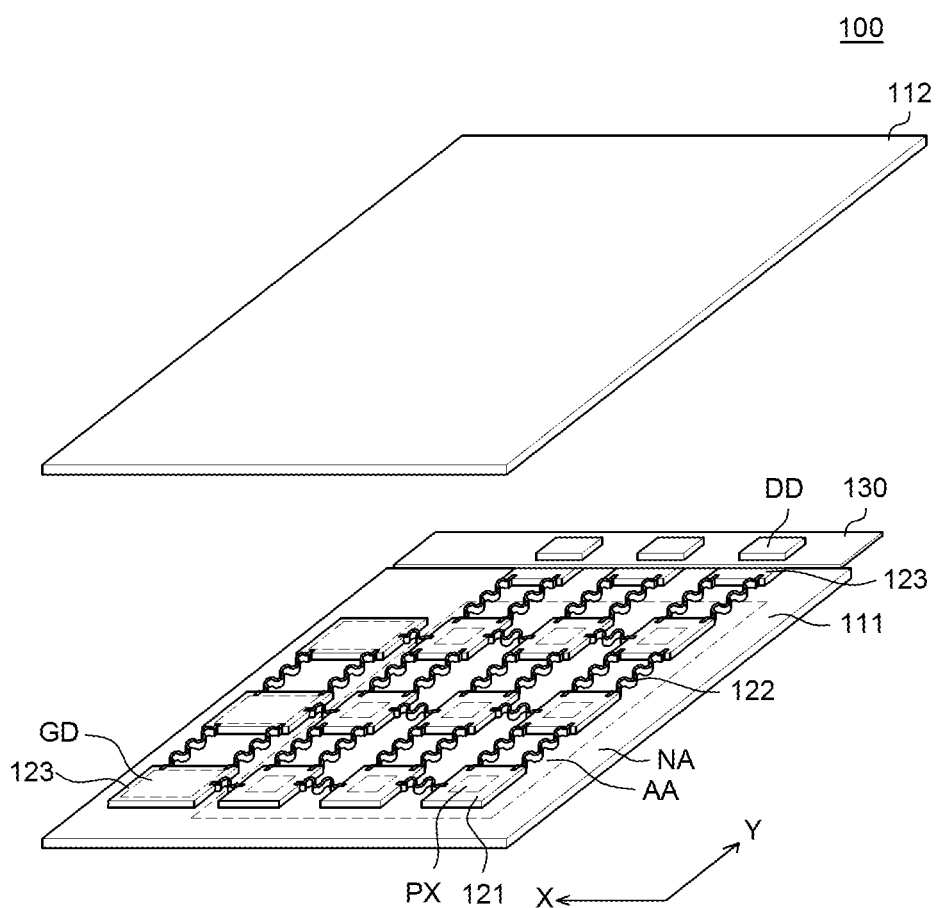
FIG. 1 is an exploded perspective view of a display device according to an embodiment of the present disclosure.

FIG. 1 is an exploded perspective view of a display device according to an embodiment of the present disclosure. Referring to FIG. 1, a display device 100 includes a lower substrate 111, an upper substrate 112, a plurality of first substrates 121, a plurality of second substrates 122, a plurality of third substrates 123 and a printed circuit board 130. Also, the display device 100 includes a plurality of pixels PX, a gate driver GD and a data driver DD.

The lower substrate 111 is a substrate for supporting and protecting various components of the display device 100. Further, the upper substrate 112 is a substrate for covering and protecting various components of the display device 100.

Each of the lower substrate 111 and the upper substrate 112 is a ductile substrate and is made of a bendable or stretchable insulating material. For example, each of the lower substrate 111 and the upper substrate 112 may be made of silicone rubber such as polydimethylsiloxane (PDMS) and an elastomer such as polyurethane (PU), or polytetrafluoroethylene (PTFE). Thus, each of the lower substrate 111 and the upper substrate 112 may have flexible properties. Further, the lower substrate 111 and the upper substrate 112 may be made of the same material, but are not limited thereto, and the material may be variously modified.

Each of the lower substrate 111 and the upper substrate 112 is a ductile substrate and may be reversibly expandable and contractible. Thus, the lower substrate 111 may also be referred to as a lower ductile substrate or a first ductile substrate, and the upper substrate 112 may also be referred to as an upper ductile substrate or a second ductile substrate. Also, the lower substrate 111 and the upper substrate 112 may have a modulus of elasticity in the range of several to hundreds of MPa. Further, the lower substrate 111 and the upper substrate 112 may have a ductile breaking rate of 100% or more. Herein, the ductile breaking rate refers to an extension distance when an object to be stretched is broken or cracked. The lower substrate may have a thickness of 10 μm to 1 mm, but is not limited thereto.

The lower substrate 111 may have an active area AA and a non-active area NA surrounding the active area AA.

The active area AA is an area where an image is displayed on the display device 100. The plurality of pixels PX is disposed in the active area AA. Also, each pixel PX may include a display element and various driving elements for driving the display element. The various driving elements may refer to at least one thin film transistor (TFT) and a capacitor, but are not limited thereto. Further, each of the plurality of pixels PX may be connected to various lines. For example, each of the plurality of pixels PX may be connected to various lines such as a gate line, a data line, a high-potential power line, a low-potential power line and a reference voltage line.

The non-active area NA is an area where an image is not displayed. The non-active area NA may be an area disposed adjacent to the active area AA and surrounding the active area AA, but is not limited thereto. The non-active area NA is an area of the lower substrate 111 except the active area AA and may be transformed and separated in various shapes. In the non-active area NA, driving elements for driving the plurality of pixels PX disposed in the active area AA are disposed. In the non-active area NA, the gate driver GD may be disposed. Further, in the non-active area NA, a plurality of pads connected to the gate driver GD and the data driver DD may be disposed. Each of the pads may be connected to each of the plurality of pixels PX disposed in the active area AA.

On the lower substrate 111, the plurality of first substrates 121, the plurality of second substrates 122 and the plurality of third substrates 123 are disposed.

The plurality of first substrates 121 is disposed in the active area AA of the lower substrate 111, and the plurality of pixels PX is disposed on the plurality of first substrates 121. Further, the plurality of third substrates 123 is disposed in the non-active area NA of the lower substrate 111, and the gate driver GD and the plurality of pads are formed on the plurality of third substrates 123.

As shown in FIG. 1, the gate driver GD may be mounted on a third substrate 123 located on one side of an X-axis direction of the active area AA among the plurality of third substrates 123. The gate driver GD may be formed on the third substrate 123 in a gate in panel (GIP) manner when various components on a first substrate 121 are fabricated. Accordingly, various circuit components constituting the gate driver GD, such as various transistors, capacitors, lines and the like, may be disposed on the plurality of third substrates 123. However, the present disclosure is not limited thereto. The gate driver GD may be mounted in a chip on film (COF) manner. Also, the plurality of third substrates 123 may be disposed in the non-active area NA located on the other side of the X-axis direction of the active area AA. The gate drivers GD may also be mounted on the plurality of third substrates 123 located on the other side of the X-axis direction of the active area AA.

Referring to FIG. 1, the plurality of third substrates 123 may be greater in size than the plurality of first substrates 121. Specifically, each of the plurality of third substrates 123 may be greater in size than each of the plurality of first substrates 121. As described above, the gate driver GD may be disposed on each of the plurality of third substrates 123. For example, one stage of the gate driver GD may be disposed on each of the plurality of third substrates 123. Accordingly, the area of various circuit components constituting one stage of the gate driver GD is relatively greater than the area of a first substrate 121 on which a pixel PX is disposed. Therefore, each of the plurality of third substrates 123 may be greater in size than each of the plurality of first substrates 121.

FIG. 1 illustrates that the plurality of third substrates 123 is disposed on one side of a Y-axis direction and one side of the X-axis direction in the non-active area NA. However, the present disclosure is not limited thereto. The plurality of third substrates 123 may be disposed in any portion of the non-active area NA. Also, FIG. 1 illustrates that each of the plurality of first substrates 121 and the plurality of third substrates 123 has a quadrangular shape. However, the present disclosure is not limited thereto. Each of the plurality of first substrates 121 and the plurality of third substrates 123 may have various shapes.

Each of the plurality of second substrates 122 connects first substrates 121 adjacent to each other, third substrates 123 adjacent to each other, or a first substrate 121 and a third substrate 123 adjacent to each other. Thus, each of the plurality of second substrates 122 may also be referred to as a connection substrate. The plurality of second substrates 122 is disposed between the plurality of first substrates 121, between the plurality of third substrates 123, or between the plurality of first substrates 121 and the plurality of third substrates 123.

Referring to FIG. 1, the plurality of second substrates 122 has a curved shape. For example, the plurality of second substrates 122 may have a sine wave shape. However, the shape of the plurality of second substrates 122 is not limited thereto. The plurality of second substrates 122 may have various shapes. For example, the plurality of second substrates 122 may be extended in a zigzag manner, or a plurality of diamond-shaped substrates may be extended by being connected to each other at their vertices. Further, the number and shape of the plurality of second substrates 122 shown in FIG. 1 are provided by way of example. The number and shape of the plurality of second substrates 122 may vary depending on the design.

Further, the plurality of first substrates 121, the plurality of second substrates 122 and the plurality of third substrates 123 are rigid substrates. The plurality of first substrates 121, the plurality of second substrates 122 and the plurality of third substrates 123 are more rigid than the lower substrate 111. The plurality of first substrates 121, the plurality of second substrates 122 and the plurality of third substrates 123 may be higher in modulus of elasticity than the lower substrate 111. The modulus of elasticity is a parameter showing the ratio of deformation of a substrate caused by a stress applied to the substrate, and when the modulus of elasticity is relatively high, the hardness may be relatively high. Thus, a first substrate 121, a second substrate 122 and a third substrate 123 may also be referred to as a first rigid substrate, a second rigid substrate and a third rigid substrate, respectively. The modulus of elasticity of the plurality of first substrates 121, the plurality of second substrates 122 and the plurality of third substrates 123 may be 1000 times or more higher than that of the lower substrate 111, but is not limited thereto.

The plurality of first substrates 121, the plurality of second substrates 122 and the plurality of third substrates 123 which are rigid substrates may be made of a plastic material having less flexibility than the lower substrate 111. For example, the plurality of first substrates 121, the plurality of second substrates 122 and the plurality of third substrates 123 may be made of polyimide (PI), polyacrylate, polyacetate, or the like. Here, the plurality of first substrates 121 and the plurality of third substrates 123 may be made of the same material, but are not limited thereto. The plurality of first substrates 121 and the plurality of third substrates 123 may also be made of different materials from each other.

In some embodiments, the lower substrate 111 may be defined as including a plurality of first lower patterns and a second lower pattern. The plurality of first lower patterns may be disposed in an area of the lower substrate 111 which overlaps the plurality of first substrates 121 and the plurality of third substrates 123. Also, the second lower pattern may be disposed in an area excluding the area where the plurality of first substrates 121 and the plurality of third substrates 123 are disposed. Otherwise, the second lower pattern may be disposed in the entire area of the display device 100.

In this case, the first lower patterns may have a higher modulus of elasticity than the second lower pattern. For example, the plurality of first lower patterns may be made of the same material as the plurality of first substrates 121 and the plurality of third substrates 123. Also, the second lower pattern may be made of a material having a lower modulus of elasticity than the plurality of first substrates 121 and the plurality of third substrates 123.

The first lower patterns may be made of polyimide (PI), polyacrylate, polyacetate, or the like. The second lower pattern may be made of silicone rubber such as polydimethylsiloxane (PDMS) and an elastomer such as polyurethane (PU), or polytetrafluoroethylene (PTFE).

The gate driver GD is a component that supplies a gate voltage to the plurality of pixels PX disposed in the active area AA. The gate driver GD includes a plurality of stages formed on the plurality of third substrates 123, and the stages of the gate driver GD may be electrically connected to each other. Therefore, a gate voltage output from one stage may be transferred to another stage. Also, each stage may sequentially may supply a gate voltage to the plurality of pixels PX connected to the stage.

A power supply may be connected to the gate driver GD and may supply a gate driving voltage and a gate clock voltage to the gate driver GD. Further, the power supply may be connected to the plurality of pixels PX and may supply a pixel driving voltage to each of the plurality of pixels PX. Further, the power supply may also be formed on the plurality of third substrates 123. The power supply may be formed adjacent to the gate driver GD on an outer substrate 121. Furthermore, power supplies formed on the plurality of third substrates 123 may be electrically connected to each other. A plurality of power supplies formed on the plurality of third substrates 123 may be connected by a gate power connection line and a pixel power connection line. Thus, each of the plurality of power supplies may supply a gate driving voltage, a gate clock voltage and a pixel driving voltage.

The printed circuit board 130 is configured to transfer a signal and voltage for driving a display element from a controller to the display element. Thus, the printed circuit board 130 may also be referred to as a driving substrate. On the printed circuit board 130, the controller such as an IC chip, or a circuit may be mounted. Further, on the printed circuit board 130, a memory, a processor or the like may also be mounted. Further, the printed circuit board 130 provided in the display device 100 may include a stretchable area and a non-stretchable area to secure stretchability. Also, on the non-stretchable area, an IC chip, a circuit, a memory, a processor or the like may be mounted. Further, in the stretchable area, lines electrically connected to the IC chip, the circuit, the memory and the processor may be disposed. Furthermore, the printed circuit board 130 may be bonded to the plurality of pads of the plurality of third substrates 123 disposed in the non-active area NA.

The data driver DD is a component that supplies a data voltage to the plurality of pixels PX disposed in the active area AA. The data driver DD may be configured as an IC chip and thus may also be referred to as a data integrated circuit (D-IC). Also, the data driver DD may be provided the non-stretchable area of the printed circuit board 130. The data driver DD may be mounted on the printed circuit board 130 in a chip on board (COB) manner. Further, the data driver DD supplies a data voltage or the like to each of the plurality of pixels PX disposed in the active area AA through the plurality of pads disposed on the plurality of third substrates 123. However, FIG. 1 illustrates that the data driver DD is mounted in the COB manner. However, the present disclosure is not limited thereto. The data driver DD may be mounted in the COF manner, the COG manner, a tape carrier package (TCP) manner, or the like.

Also, FIG. 1 illustrates that a third substrate 123 is disposed in the non-active area NA on an upper side of the active area AA so as to correspond to a first substrate 121 disposed on a row in the active area AA. Further, FIG. 1 illustrates that a data driver DD is disposed on a third substrate 123. However, the present disclosure is not limited thereto. A third substrate 123 and a data driver DD may be disposed so as to correspond to first substrates 121 disposed on a plurality of rows.

Hereinafter, the active area AA of the display device 100 according to an embodiment of the present disclosure will be described in more detail with reference to FIG. 2 and FIG. 3.

Planar and Cross-Sectional Structures of Active Area

Figure 2:
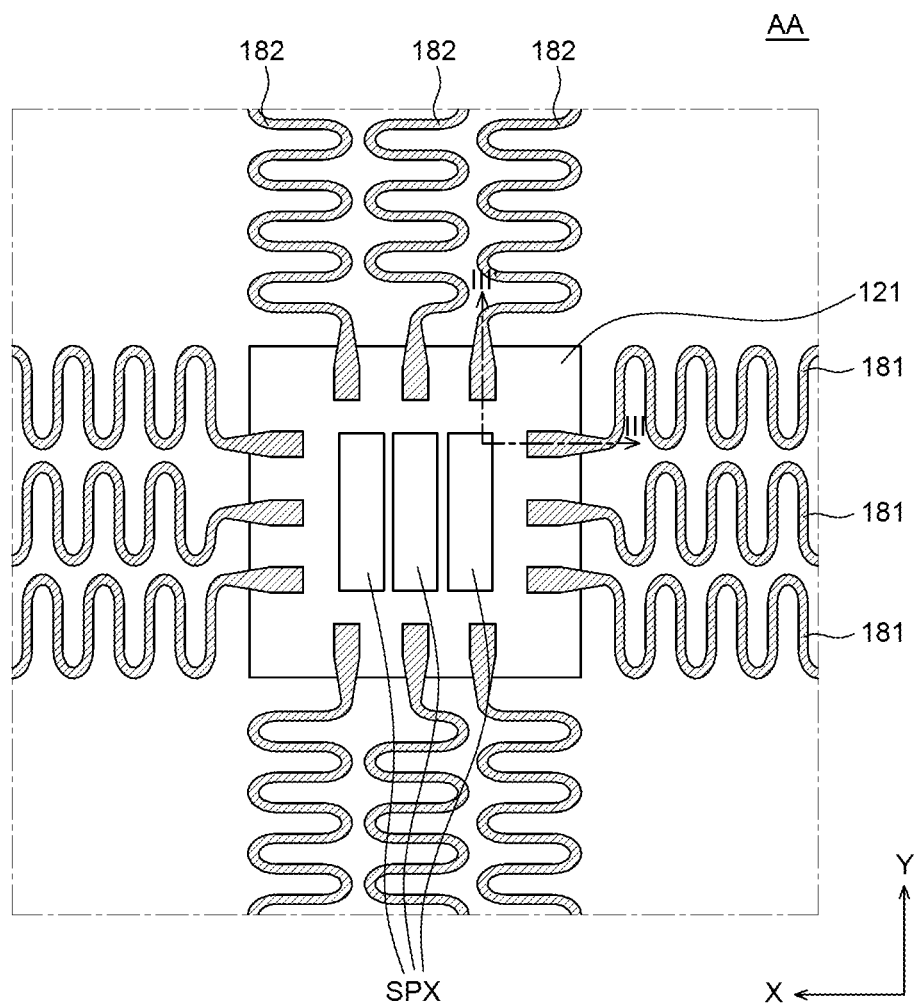
FIG. 2 is an enlarged plan view of an active area of the display device according to an embodiment of the present disclosure.

FIG. 2 is an enlarged plan view of an active area of the display device according to an embodiment of the present disclosure. FIG. 3 is a schematic cross-sectional view as taken along a line of FIG. 2. For the convenience of description, FIG. 1 will also be referred to hereinafter.

Referring to FIG. 1 and FIG. 2, the plurality of first substrates 121 is disposed on the lower substrate 111 in the active area AA. The plurality of first substrates 121 is disposed to be spaced apart from each other on the lower substrate 111. For example, the plurality of first substrates 121 may be disposed in a matrix form on the lower substrate 111 as shown in FIG. 1, but is not limited thereto.

Figure 3:
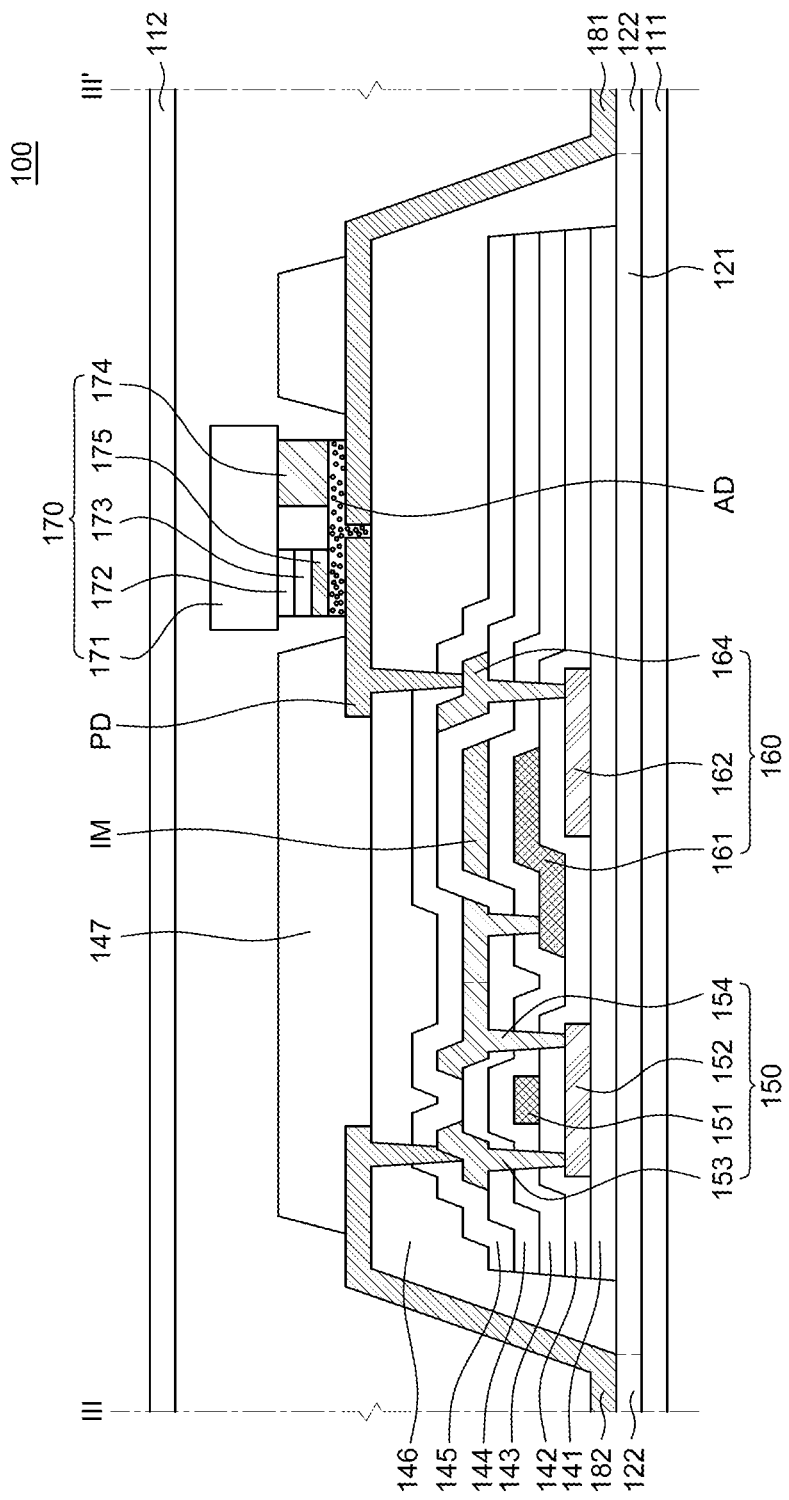
FIG. 3 is a schematic cross-sectional view as taken along a line of FIG. 2.

Referring to FIG. 2 and FIG. 3, a pixel PX including a plurality of sub-pixels SPX is disposed on the first substrate 121. Also, each of the sub-pixels SPX may include an LED 170, which is a display element and a driving transistor 160 and a switching transistor 150 for driving the LED 170. However, a display element in each sub-pixel SPX is not limited to the LED and may be an organic light emitting diode. Further, the plurality of sub-pixels SPX may include a red sub-pixel, a green sub-pixel and a blue sub-pixel, but is not limited thereto. The plurality of sub-pixels SPX may include various color pixels as needed.

The plurality of sub-pixels SPX may be connected to a plurality of connection lines 180. The plurality of sub-pixels SPX may be electrically connected to first connection lines 181 extended in the X-axis direction. Also, the plurality of sub-pixels SPX may be electrically connected to second connection lines 182 extended in the Y-axis direction.

Hereinafter, a cross-sectional structure of the display area will be described in detail with reference to FIG. 3.

Referring to FIG. 3, a plurality of inorganic insulating layers is disposed on the plurality of first substrates 121. For example, the plurality of inorganic insulating layers may include a buffer layer 141, a gate insulating layer 142, a first interlayer insulating layer 143, a second interlayer insulating layer 144 and a passivation layer 145. However, the present disclosure is not limited thereto. Various inorganic insulating layers may be further disposed on the plurality of first substrates 121. One or more of the buffer layer 141, the gate insulating layer 142, the first interlayer insulating layer 143, the second interlayer insulating layer 144 and the passivation layer 145 may be omitted.

Specifically, the buffer layer 141 is disposed on the plurality of first substrates 121. The buffer layer 141 is formed on the plurality of first substrates 121 to protect various components of the display device 100 against permeation of moisture ($H_2O$) and oxygen ($O_2$) from the outside of the lower substrate 111 and the plurality of first substrates 121. The buffer layer 141 may be made of an insulating material. For example, the buffer layer 141 may be formed as a single inorganic layer or a plurality of inorganic layers of silicon nitride ($SiN_x$), silicon oxide ($SiO_x$), silicon oxynitride (SiON), or the like. However, the buffer layer 141 may be omitted depending on the structure or characteristics of the display device 100.

In this case, the buffer layer 141 may be formed only in an area where the buffer layer 141 overlaps the plurality of first substrates 121 and the plurality of third substrates 123. As described above, the buffer layer 141 may be made of an inorganic material. Thus, the buffer layer 141 may be easily damaged, such as easily cracked, while the display device 100 is stretched. Therefore, the buffer layer 141 may not be formed in areas between the plurality of first substrates 121 and the plurality of third substrates 123. The buffer layer 141 may be patterned into the shapes of the plurality of first substrates 121 and the plurality of third substrates 123 and formed only on upper portions of the plurality of first substrates 121 and the plurality of third substrates 123. Accordingly, in the display device 100 according to an embodiment of the present disclosure, the buffer layer 141 is formed only in the area where the buffer layer 141 overlaps the plurality of first substrates 121 and the plurality of third substrates 123 which are rigid substrates. Thus, it is possible to suppress damage to the buffer layer 141 even when the display device 100 is deformed, such as bent or stretched.

Referring to FIG. 3, the switching transistor 150 including a gate electrode 151, an active layer 152, a source electrode 153 and a drain electrode 154 is formed on the buffer layer 141. Also, the driving transistor 160 including a gate electrode 161, an active layer 162, a source electrode and a drain electrode 164 is formed on the buffer layer 141.

First, referring to FIG. 3, the active layer 152 of the switching transistor 150 and the active layer 162 of the driving transistor 160 are disposed on the buffer layer 141. For example, each of the active layer 152 of the switching transistor 150 and the active layer 162 of the driving transistor 160 may be made of an oxide semiconductor. Each of the active layer 152 of the switching transistor 150 and the active layer 162 of the driving transistor 160 may be made of amorphous silicon (a-Si), polycrystalline silicon (poly-Si), an organic semiconductor or the like.

The gate insulating layer 142 is disposed on the active layer 152 of the switching transistor 150 and the active layer 162 of the driving transistor 160. The gate insulating layer 142 is configured to electrically insulate the gate electrode 151 of the switching transistor 150 from the active layer 152 of the switching transistor 150 and electrically insulate the gate electrode 161 of the driving transistor 160 from the active layer 162 of the driving transistor 160. Further, the gate insulating layer 142 may be made of an insulating material. For example, the gate insulating layer 142 may be formed as a single inorganic layer or a plurality of inorganic layers of silicon nitride ($SiN_x$) or silicon oxide ($SiO_x$), but is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed to be spaced apart from each other on the gate insulating layer 142. Further, the gate electrode 151 of the switching transistor 150 overlaps the active layer 152 of the switching transistor 150, and the gate electrode 161 of the driving transistor 160 overlaps the active layer 162 of the driving transistor 160.

Each of the gate electrode 151 of the switching transistor 150 and the gate electrode 161 of the driving transistor 160 may be made of any one of various metal materials, for example, any one of molybdenum (Mo), aluminum (Al), chromium (Cr), gold (Au), titanium (Ti), nickel (Ni), neodymium (Nd) and copper (Cu). Alternatively, each of the gate electrode 151 of the switching transistor 150 and the gate electrode 161 of the driving transistor 160 may be made of an alloy of two or more of them, or a plurality of layer thereof, but is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may also be made of an inorganic material like the buffer layer 141. For example, the first interlayer insulating layer 143 may be formed as a single inorganic layer or a plurality of inorganic layers of silicon nitride (SiNx) or silicon oxide (SiOx), but is not limited thereto.

The intermediate metal layer IM is disposed on the first interlayer insulating layer 143. Further, the intermediate metal layer IM overlaps the gate electrode 161 of the driving transistor 160. Thus, a storage capacitor is formed in an area where the intermediate metal layer IM overlaps the gate electrode 161 of the driving transistor 160. Specifically, the gate electrode 161 of the driving transistor 160, the first interlayer insulating layer 143 and the intermediate metal layer IM form the storage capacitor. However, the position of the intermediate metal layer IM is not limited thereto. The intermediate metal layer IM may overlap another electrode to form a storage capacitor in various ways.

The intermediate metal layer IM may be made of any one of various metal materials, for example, any one of molybdenum (Mo), aluminum (Al), chromium (Cr), gold (Au), titanium (Ti), nickel (Ni), neodymium (Nd) and copper (Cu). Alternatively, the intermediate metal layer IM may be made of an alloy of two or more of them, or a plurality of layer thereof, but is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. Also, the second interlayer insulating layer 144 insulates the intermediate metal layer IM from the source electrode 163 and the drain electrode 164 of the driving transistor 160. The second interlayer insulating layer 144 may also be made of an inorganic material like the buffer layer 141. For example, the first interlayer insulating layer 143 may be formed as a single inorganic layer or a plurality of inorganic layers of silicon nitride (SiNx) or silicon oxide (SiOx), but is not limited thereto.

The source electrode 153 and the drain electrode 154 of the switching transistor 150 are disposed on the second interlayer insulating layer 144. Also, the source electrode and the drain electrode 164 of the driving transistor 160 are disposed on the second interlayer insulating layer 144. The source electrode 153 and the drain electrode 154 of the switching transistor 150 are disposed to be spaced apart from each other on the same layer. Further, although FIG. 3 does not illustrate the source electrode of the driving transistor 160, the source electrode and the drain electrode 164 of the driving transistor 160 are also disposed to be spaced apart from each other on the same layer. In the switching transistor 150, the source electrode 153 and the drain electrode 154 may be electrically connected to the active layer 152 to be in contact with the active layer 152. Also, in the driving transistor 160, the source electrode and the drain electrode 164 may be electrically connected to the active layer 162 to be in contact with the active layer 162. Further, the drain electrode 154 of the switching transistor 150 may be electrically connected to the gate electrode 161 of the driving transistor 160 to be in contact with the gate electrode 161 of the driving transistor 160.

The source electrode 153 and the drain electrodes 154 and 164 may be made of any one of various metal materials, for example, any one of molybdenum (Mo), aluminum (Al), chromium (Cr), gold (Au), titanium (Ti), nickel (Ni), neodymium (Nd) and copper (Cu). Alternatively, the source electrode 153 and the drain electrodes 154 and 164 may be made of an alloy of two or more of them, or a plurality of layer thereof, but are not limited thereto.

Further, in the present disclosure, the driving transistor 160 has been described as having a coplanar structure, but various types of transistors having a staggered structure or the like may also be used.

Further, although not shown in FIG. 3, a gate pad and a data pad may be disposed on the second interlayer insulating layer 144. The gate pad serves to transfer a gate voltage to the plurality of sub-pixels SPX. The gate voltage may be transferred from the gate pad to the gate electrode 151 of the switching transistor 150 through a gate line formed on the first substrate 121. The data pad serves to transfer a data voltage to the plurality of sub-pixels SPX. The data voltage may be transferred from the data pad to the source electrode 153 of the switching transistor 150 through a data line formed on the first substrate 121. The gate pad and the data pad may be made of the same material as the source electrode 153 and the drain electrodes 154 and 164, but are not limited thereto.

Referring to FIG. 3, the passivation layer 145 is formed on the switching transistor 150 and the driving transistor 160. The passivation layer 145 covers the switching transistor 150 and the driving transistor 160 to protect the switching transistor 150 and the driving transistor 160 against permeation of moisture, oxygen, and the like. The passivation layer 145 may be made of an inorganic material and formed as a single layer or a plurality of layers, but is not limited thereto.

Also, the gate insulating layer 142, the first interlayer insulating layer 143, the second interlayer insulating layer 144 and the passivation layer 145 may be patterned and formed only in an area where they overlap the plurality of first substrates 121. The gate insulating layer 142, the first interlayer insulating layer 143, the second interlayer insulating layer 144 and the passivation layer 145 may also be made of an inorganic material like the buffer layer 141. Thus, the gate insulating layer 142, the first interlayer insulating layer 143, the second interlayer insulating layer 144 and the passivation layer 145 may be easily damaged, such as easily cracked, while the display device 100 is stretched. Therefore, the gate insulating layer 142, the first interlayer insulating layer 143, the second interlayer insulating layer 144 and the passivation layer 145 may not be formed in areas between the plurality of first substrates 121. The gate insulating layer 142, the first interlayer insulating layer 143, the second interlayer insulating layer 144 and the passivation layer 145 may be patterned into the shapes of the plurality of first substrates 121 and formed only on upper portions of the plurality of first substrates 121.

A planarization layer 146 is formed on the passivation layer 145. The planarization layer 146 serves to flatten upper portions of the switching transistor 150 and the driving transistor 160. The planarization layer 146 may be formed as a single layer or a plurality of layers and may be made of an organic material. Thus, the planarization layer 146 may also be referred to as an organic insulating layer. For example, the planarization layer 146 may be made of an acrylic-based organic material, but is not limited thereto.

Referring to FIG. 3, the planarization layer 146 is disposed on the plurality of first substrates 121 so as to cover upper surfaces and side surfaces of the buffer layer 141, the gate insulating layer 142, the first interlayer insulating layer 143, the second interlayer insulating layer 144 and the passivation layer 145. Thus, the planarization layer 146 surrounds the buffer layer 141, the gate insulating layer 142, the first interlayer insulating layer 143, the second interlayer insulating layer 144 and the passivation layer 145 together with the plurality of first substrates 121. Specifically, the planarization layer 146 may be disposed to cover an upper surface and a side surface of the passivation layer 145, a side surface of the first interlayer insulating layer 143, a side surface of the second interlayer insulating layer 144, a side surface of the gate insulating layer 142, a side surface of the buffer layer 141 and a part of upper surfaces of the plurality of first substrates 121. Thus, the planarization layer 146 may compensate for steps between the side surfaces of the buffer layer 141, the gate insulating layer 142, the first interlayer insulating layer 143, the second interlayer insulating layer 144 and the passivation layer 145. Also, the planarization layer 146 may enhance adhesion strength between the planarization layer 146 and the connection lines 180 disposed on a side surface of the planarization layer 146.

Referring to FIG. 3, an incline angle of the side surface of the planarization layer 146 may be smaller than those of the side surfaces of the buffer layer 141, the gate insulating layer 142, the first interlayer insulating layer 143, the second interlayer insulating layer 144 and the passivation layer 145. For example, the side surface of the planarization layer 146 may have a smaller incline than the side surface of the passivation layer 145, the side surface of the first interlayer insulating layer 143, the side surface of the second interlayer insulating layer 144, the side surface of the gate insulating layer 142 and the side surface of the buffer layer 141. Thus, the connection lines 180 in contact with the side surface of the planarization layer 146 are disposed to have a small incline. Therefore, when the display device 100 is stretched, a stress generated in the connection lines 180 may be reduced. Also, it is possible to suppress cracks in the connection lines 180 or peeling of the connection lines 180 from the side surface of the planarization layer 146.

Referring to FIG. 2 and FIG. 3, the connection lines 180 refer to lines that electrically connect the pads disposed on the plurality of first substrates 121. The connection lines 180 are disposed on the plurality of second substrates 122. Also, a part of the connection lines 180 may also be formed on the plurality of first substrates 121 to be electrically connected to the pads disposed on the plurality of first substrates 121. The above-described pads disposed on the first substrates 121 refer to a plurality of contact pads 170 and the gate and data pads.

The connection lines 180 include the first connection lines 181 and the second connection lines 182. The first connection lines 181 and the second connection lines 182 are disposed between the plurality of first substrates 121. Specifically, the first connection lines 181 refer to lines extended in the X-axis direction between the plurality of first substrates 121 among the connection lines 180. The second connection lines 182 refer to lines extended in the Y-axis direction between the plurality of first substrates 121 among the connection lines 180.

The connection lines 180 may be made of a metal material such as copper (Cu), aluminum (Al), titanium (Ti) or molybdenum (Mo). Otherwise, the connection lines 180 may have a laminated structure of metal materials such as copper/ molybdenum-titanium (Cu/MoTi), titanium/aluminum/titanium (Ti/Al/Ti), or the like, but are not limited thereto.

In a general display device, various lines such as a plurality of gate lines and a plurality of data lines are extended in straight lines and are disposed between a plurality of sub-pixels. Also, the plurality of sub-pixels is connected to a single signal line. Therefore, in the general display device, various lines such as a gate line, a data line, a high-potential power line and a reference voltage line are continuously extended on a substrate from one side to the other side of an organic light emitting display device.

Unlike this, in the display device 100 according to an embodiment of the present disclosure, various lines such as a gate line, a data line, a high-potential power line and a reference voltage line which are formed in straight lines and considered to be used in the general organic light emitting display device, are disposed only on the plurality of first substrates 121 and the plurality of third substrates 123. In the display device 100 according to an embodiment of the present disclosure, lines formed in straight lines are disposed only on the plurality of first substrates 121 and the plurality of third substrates 123.

In the display device 100 according to an embodiment of the present disclosure, the pads on two adjacent first substrates 121 or two adjacent third substrate 123 may be connected by the connection lines 180 to connect discontinuous lines on the first substrates 121 or the third substrates 123. The connection lines 180 electrically connect the pads on the two adjacent first substrates 121, the two adjacent third substrate 123 and the first substrate 121 and the third substrate 123 adjacent to each other. Therefore, the display device 100 according to an embodiment of the present disclosure may include the plurality of connection lines 180 to electrically connect various lines, such as a gate line, a data line, a high-potential power line and a reference voltage line, between the plurality of first substrates 121, between the plurality of third substrates 123 and between the plurality of first substrates 121 and the plurality of third substrates 123. For example, gate lines may be disposed on the plurality of first substrates 121 disposed adjacent to each other in the X-axis direction. Also, the gate pads may be disposed on both ends of the gate lines. In this case, a plurality of gate pads on the plurality of first substrates 121 disposed adjacent to each other in the X-axis direction may be connected to each other by the first connection lines 181 serving as the gate lines. Therefore, the gate lines disposed on the plurality of first substrates 121 and the first connection lines 181 disposed on the third substrates 123 may serve as a single gate line. Further, lines, such as a light emission signal line, a low-potential power line and a high-potential power line which are extended in the X-axis direction among all of various lines that may be included in the display device 100, may also be electrically connected by the first connection lines 181 as described above.

Referring to FIG. 2 and FIG. 3, the first connection lines 181 may connect pads on two first substrates 121 disposed side by side among the pads on the plurality of first substrates 121 disposed adjacent to each other in the X-axis direction. Each first connection line 181 may serve as a gate line, a light emission signal line, a high-potential power line, or a low-potential power line, but is not limited thereto. For example, the first connection lines 181 may serve as gate lines and electrically connect the gate pads on the two first substrates 121 disposed side by side in the X-axis direction. Therefore, as described above, the gate pads on the plurality of first substrates 121 disposed in the X-axis direction may be connected by the first connection lines 181 serving as the gate lines. A single gate voltage may be transferred to the gate pads.

Further, the second connection lines 182 may connect the pads on two first substrates 121 disposed side by side among the pads on the plurality of first substrates 121 disposed adjacent to each other in the Y-axis direction. Each second connection line 182 may serve as a data line, a high-potential power line, a low-potential power line or a reference voltage line, but is not limited thereto. For example, the second connection lines 182 may serve as data lines and electrically connect data lines on two first substrates 121 disposed side by side in the Y-axis direction. Therefore, as described above, internal lines on the plurality of first substrates 121 disposed in the Y-axis direction may be connected by a plurality of second connection lines 182 serving as the data lines. A single data voltage may be transferred to the data lines.

Referring to FIG. 1, the connection lines 180 may further include third connection lines that connect the pads on the plurality of first substrates 121 and the plurality of third substrates 123 or connect pads on two third substrates 123 disposed side by side among the pads on the plurality of third substrates 123 disposed adjacent to each other in the Y-axis direction.

As shown in FIG. 3, each first connection line 181 may be in contact with an upper surface and the side surface of the planarization layer 146 disposed on the first substrate 121 and may be extended to an upper surface of the second substrate 122. Also, each second connection line 182 may be in contact with the upper surface and the side surface of the planarization layer 146 disposed on the first substrate 121 and may be extended to the upper surface of the second substrate 122.

Referring to FIG. 3, a bank 147 is formed on a connection pad PD, the connection lines 180 and the planarization layer 146. The bank 147 is a component to distinguish adjacent sub-pixels SPX. The bank 147 is disposed to cover at least a part of the pad PD, the connection lines 180 and the planarization layer 146. The bank 147 may be made of an insulating material. Further, the bank 147 may contain a black material. Since the bank 147 contains a black material, the bank 147 serves to hide lines which are visible through the active area AA. The bank 147 may be made of, for example, a transparent carbon-based mixture. Specifically, the bank 147 may contain carbon black, but is not limited thereto. The bank 147 may also be made of a transparent insulating material.

Referring to FIG. 3, the LED 170 is disposed on the connection pad PD and the first connection lines 181. The LED 170 includes an n-type layer 171, an active layer 172, a p-type layer 173, an n-electrode 174 and a p-electrode 175. The LED 170 of the display device 100 according to an embodiment of the present disclosure has a flip-chip structure in which the n-electrode 174 and the p-electrode 175 are formed on one surface thereof.

The n-type layer 171 may be formed by injecting n-type impurities into gallium nitride (GaN) having excellent crystallinity. The n-type layer 171 may be disposed on a separate base substrate which is made of a light emitting material.

The active layer 172 is disposed on the n-type layer 171. The active layer 172 is a light emitting layer that emits light in the LED 170 and may be made of a nitride semiconductor, for example, indium gallium nitride (InGaN). The p-type layer 173 is disposed on the active layer 172. The p-type layer 173 may be formed by injecting p-type impurities into gallium nitride (GaN).

As described above, the LED 170 according to an embodiment of the present disclosure is manufactured by sequentially laminating the n-type layer 171, the active layer 172, and the p-type layer 173, and then, etching a predetermined area (or selected area) of the layers to thereby form the n-electrode 174 and the p-electrode 175. In this case, the predetermined area (or selected area) is a space to separate the n-electrode 174 and the p-electrode 175 from each other and is etched to expose a part of the n-type layer 171. In other words, a surface of the LED 170 on which the n-electrode 174 and the p-electrode 175 are to be disposed may not be flat and may have different levels of height.

The n-electrode 174 is disposed on the etched area, e.g., on the n-type layer 171 which is exposed by etching. The n-electrode 174 may be made of a conductive material. Meanwhile, the p-electrode 175 is disposed on a non-etched area, e.g., on the p-type layer 173. The p-electrode 175 may be made of a conductive material. For example, the p-electrode 175 may be made of the same material as the n-electrode 174.

An adhesive layer AD is disposed on upper surfaces of the connection pad PD and the first connection lines 181 and between the connection pad PD and the first connection lines 181. Thus, the LED 170 may be bonded onto the connection pad PD and the first connection lines 181. In this case, the n-electrode 174 may be disposed on the first connection lines 181 and the p-electrode 175 may be disposed on the connection pad PD.

The adhesive layer AD may be a conductive adhesive layer formed by dispersing conductive balls in an insulating base member. Thus, when heat or pressure is applied to the adhesive layer AD, the conductive balls are electrically connected to have conductive properties in a portion of the adhesive layer AD to which heat or pressure is applied. Also, an area of the adhesive layer AD to which pressure is not applied may have insulating properties. For example, the n-electrode 174 is electrically connected to the first connection lines 181 through the adhesive layer AD, and the p-electrode 175 is electrically connected to the connection pad PD through the adhesive layer AD. After applying the adhesive layer AD to upper surfaces of the first connection lines 181 and the connection pad PD by an inkjet method or the like, the LED 170 may be transferred onto the adhesive layer AD. Then, the LED 170 may be pressed and heated to thereby electrically connect the connection pad PD to the p-electrode 175 and the first connection lines 181 to the n-electrode 174. However, other portions of the adhesive layer AD excluding a portion of the adhesive layer AD between the n-electrode 174 and first connection lines 181 and a portion of the adhesive layer AD between the p-electrode 175 and the connection pad PD have insulating properties. Meanwhile, the adhesive layer AD may be separately disposed on each of the connection pad PD and the first connection lines 181.

Further, the connection pad PD is electrically connected to the drain electrode 164 of the driving transistor 160 and receives a driving voltage for driving the LED 170 from the driving transistor 160. Furthermore, a low-potential driving voltage for driving the LED 170 is applied to the first connection lines 181. Thus, when the display device 100 is turned on, different levels of voltage applied to each of the connection pad PD and the first connection lines 181 are transferred to the n-electrode 174 and the p-electrode 175. Accordingly, the LED 170 emits light.

Referring to FIG. 3, an upper substrate 112 is disposed on the bank 147, the LED 170 and the lower substrate 111.

The upper substrate 112 serves to support various components disposed under the upper substrate 112. Specifically, the upper substrate 112 may be formed by coating and hardening a material forming the upper substrate 112 on the lower substrate 111 and the first substrates 121. Thus, the upper substrate 112 may be disposed to be in contact with the lower substrate 111, the first substrates 121, the second substrate 122 and the connection lines 180.

The upper substrate 112 may be made of the same material as the lower substrate 111. For example, the upper substrate 112 may be made of silicone rubber such as polydimethylsiloxane (PDMS) and an elastomer such as polyurethane (PU), and or polytetrafluoroethylene (PTFE). Thus, the upper substrate 112 may have flexibility. However, the materials of the upper substrate 112 are not limited thereto.

Meanwhile, although not shown in FIG. 3, a polarizing layer may also be disposed on the upper substrate 112. The polarizing layer polarizes light incident from the outside of the display device 100 and reduces reflection of external light. Further, instead of the polarizing layer, other optical films or the like may be disposed on the upper substrate 112.

Circuit Structure of Active Area

Figure 4:
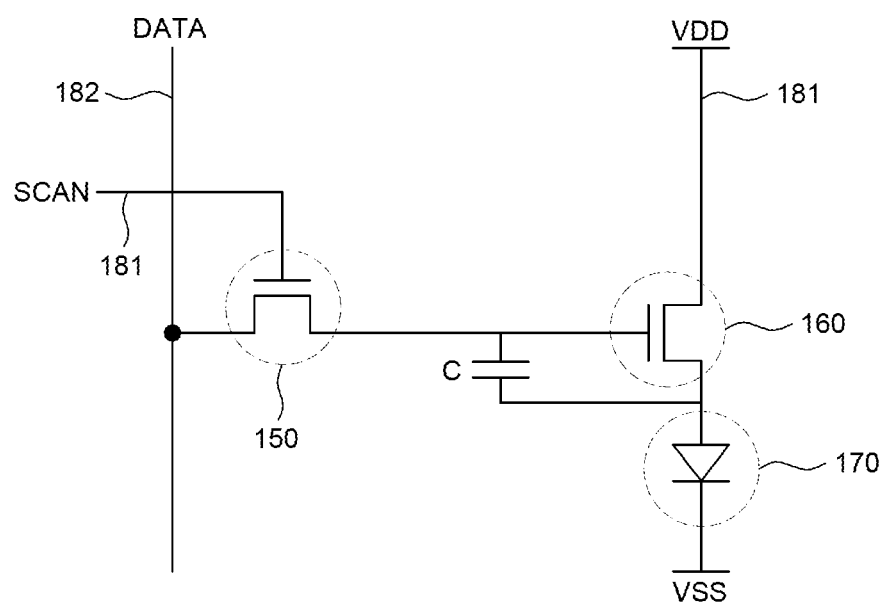
FIG. 4 is a circuit diagram of a sub-pixel of the display device according to an embodiment of the present disclosure.

FIG. 4 is a circuit diagram of a sub-pixel of the display device according to an embodiment of the present disclosure.

Hereinafter, for the convenience of description, a structure and an operation when a sub-pixel SPX of the display device according to an embodiment of the present disclosure is a pixel circuit of 2T (transistor) 1C (capacitor) will be described. However, the present disclosure is not limited thereto.

Referring to FIG. 3 and FIG. 4, in the display device according to an embodiment of the present disclosure, each sub-pixel SPX may include a switching transistor 150, a driving transistor 160, a storage capacitor C and an LED 170.

The switching transistor 150 applies a data signal DATA supplied through the second connection lines 182 to the driving transistor 160 and the storage capacitor C in response to a gate signal SCAN supplied through the first connection lines 181.

Further, the gate electrode 151 of the switching transistor 150 is electrically connected to the first connection lines 181. Also, the source electrode 153 of the switching transistor 150 is connected to the second connection lines 182. Further, the drain electrode 154 of the switching transistor 150 is connected to the gate electrode 161 of the driving transistor 160.

The driving transistor 160 may operate to enable a driving current according to a high-potential power VDD and the data voltage DATA supplied through the first connection lines 181 to flow in response to the data voltage DATA stored in the storage capacitor C.

Further, the gate electrode 161 of the driving transistor 160 is electrically connected to the drain electrode 154 of the switching transistor 150. Furthermore, the source electrode of the driving transistor 160 is connected to the first connection lines 181. Moreover, the drain electrode 164 of the driving transistor 160 is connected to the LED 170.

The LED 170 may operate to emit light according to a driving current formed by the driving transistor 160. Also, as described above, the n-electrode 174 of the LED 170 may be connected to the first connection lines 181 and thus may be applied with a low-potential power VSS. Further, the p-electrode 175 of the LED 170 may be connected to the drain electrode 164 of the driving transistor 160 and thus may be applied with a driving voltage corresponding to the driving current.

Each sub-pixel SPX of the display device according to an embodiment of the present disclosure is configured to have a 2T1C structure including the switching transistor 150, the driving transistor 160, the storage capacitor C and the LED 170 as an example. However, when a compensation circuit is added, each sub-pixel SPX may be configured in various ways, such as 3T1C, 4T2C, 5T2C, 6T1C, 6T2C, 7T1C or 7T2C.

As described above, the display device according to an embodiment of the present disclosure may include a plurality of sub-pixels on a first substrate which is a rigid substrate. Each of the plurality of sub-pixels SPX may include a switching transistor, a driving transistor, a storage capacitor and an LED.

Therefore, the display device according to an embodiment of the present disclosure may be stretched due to a lower substrate. Also, each first substrate includes a pixel circuit having a 2T1C structure. Thus, it is possible to emit light depending on a data voltage at each gate timing.

Hereinafter, a display device 200 according to another embodiment of the present disclosure will be described in detail. The display device 200 according to another embodiment of the present disclosure is different from the display device 100 according to an embodiment of the present disclosure only in terms of a placement relationship between a plurality of first substrates and a plurality of connection lines. Accordingly, a detailed description of the same parts as those of the display device according to an embodiment of the present disclosure will be omitted, and the above-described difference will be described in detail.

Another Embodiment of Present Disclosure

Figure 5:
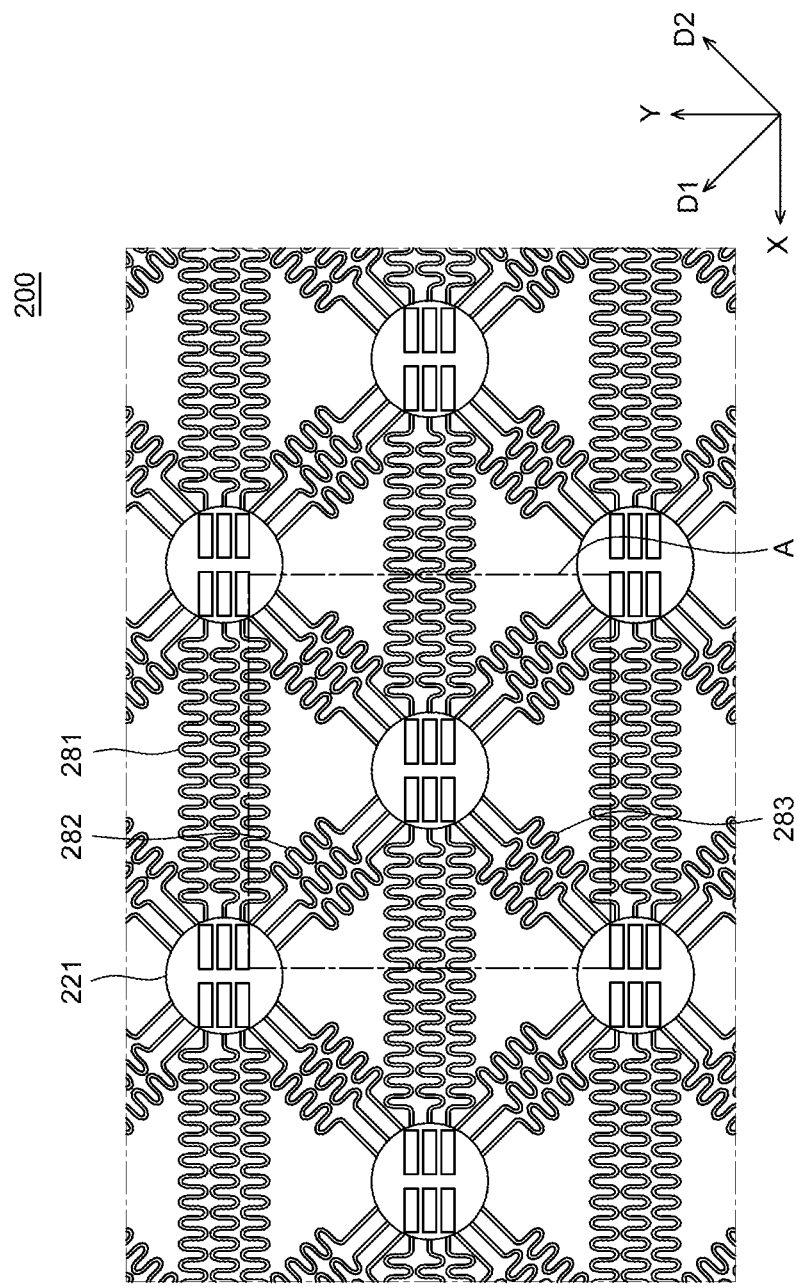
FIG. 5 is an enlarged plan view of an active area of a display device according to another embodiment of the present disclosure.
Figure 6A:
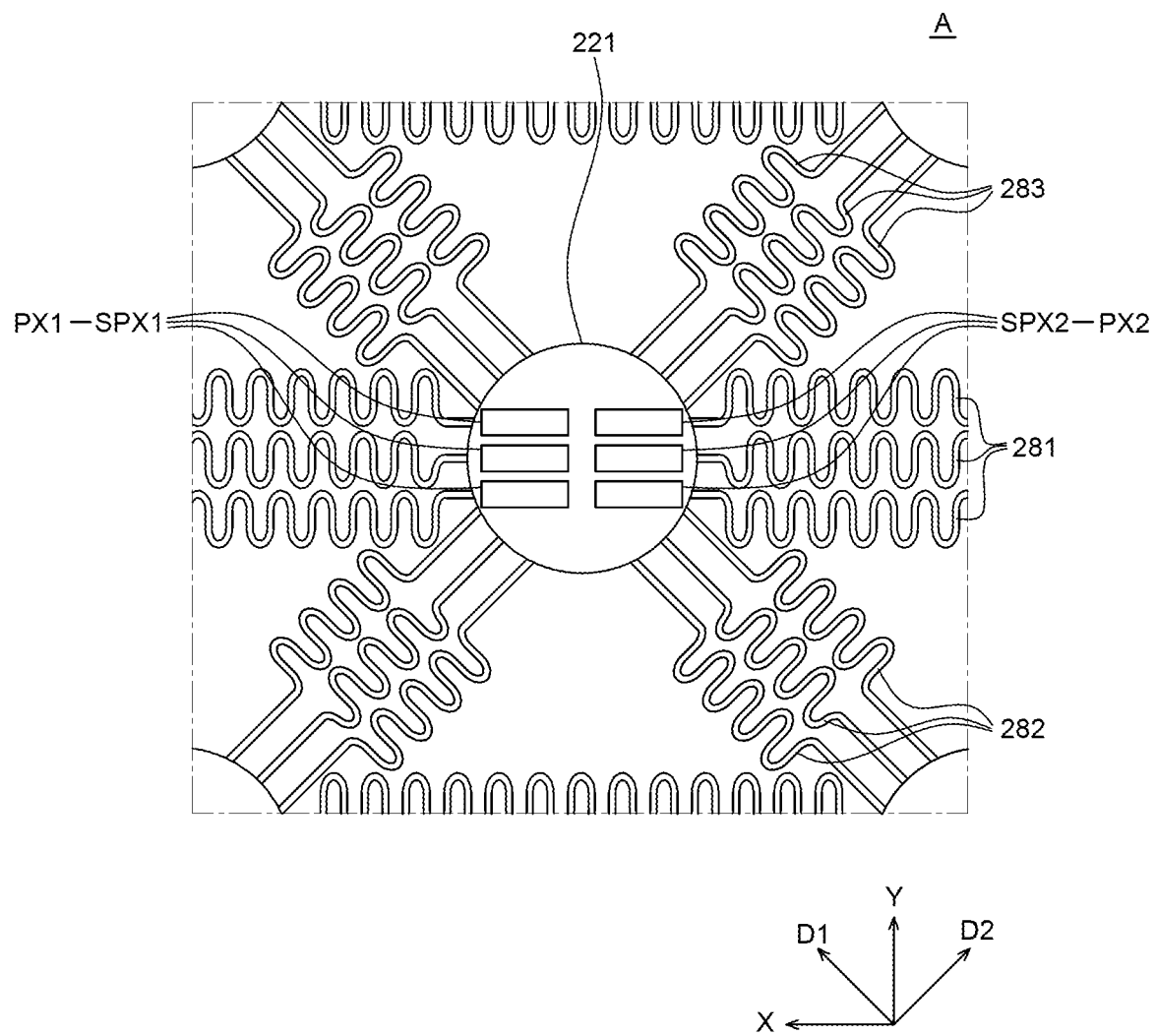
FIG. 6A and FIG. 6B are enlarged plan views of a first substrate of the display device according to another embodiment of the present disclosure.
Figure 6B:
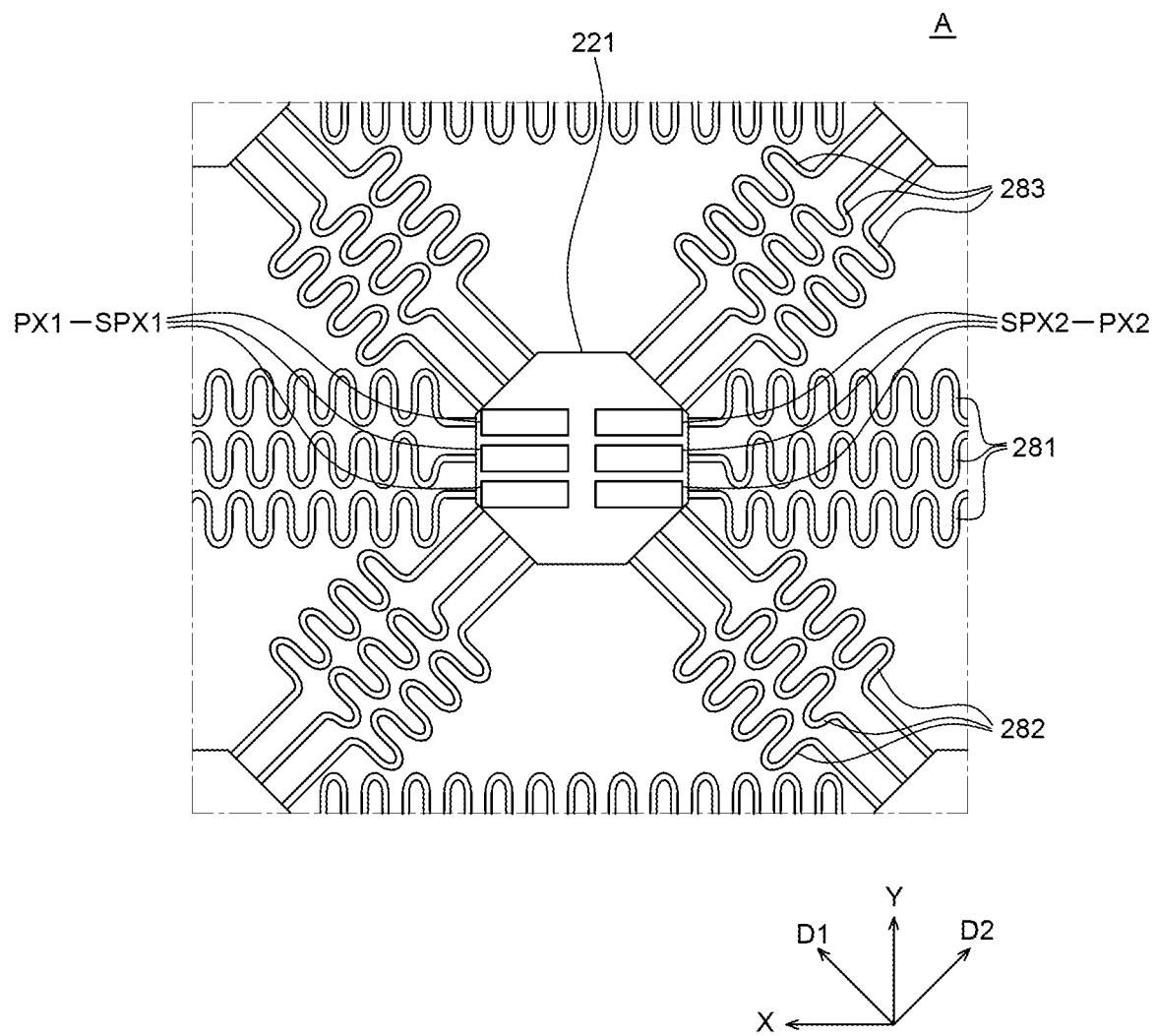
Figure 7:
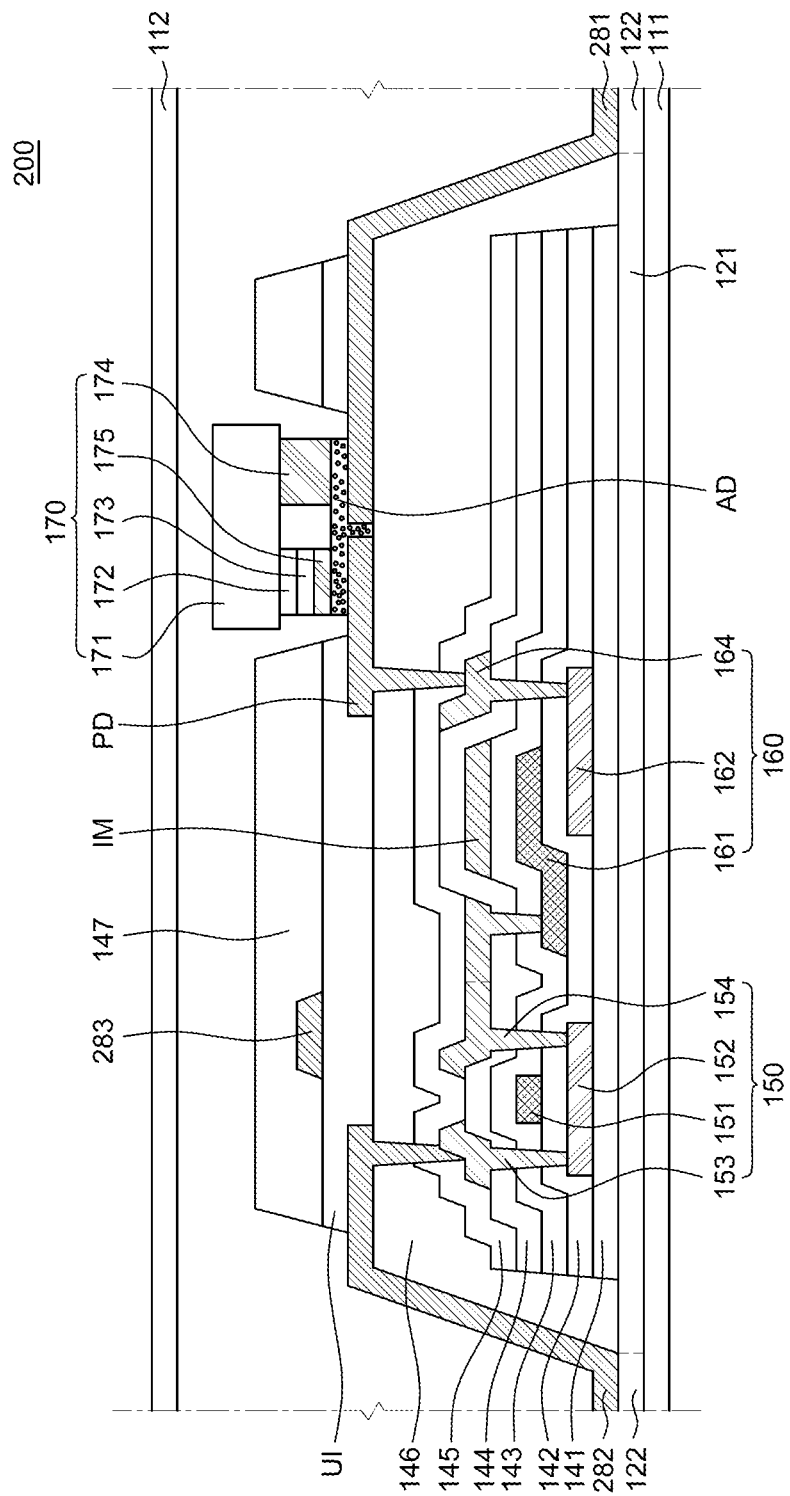
FIG. 7 is a cross-sectional view of a sub-pixel of the display device according to another embodiment of the present disclosure.

FIG. 5 is an enlarged plan view of an active area of a display device according to another embodiment of the present disclosure. FIG. 6A and FIG. 6B are enlarged plan views of a first substrate of the display device according to another embodiment of the present disclosure. FIG. 7 is a cross-sectional view of a sub-pixel of the display device according to another embodiment of the present disclosure.

As shown in FIG. 5, in the display device 200 according to another embodiment of the present disclosure, a plurality of first substrates 221 may have a hexagonal or a polygonal shape more than six sides or a circular shape. A plurality of connection lines 280 may include first connection lines 281 extended in a first direction X, second connection lines 282 extended in a second direction D1 and third connection lines 283 extended in a third direction D2.

The above-described first direction X may be defined as an X-axis direction, and each of the second direction D1 and the third direction D2 may be defined as a direction diagonal to the X-axis direction. For example, the first direction X may have an angle of 0° with respect to the X-axis direction and the second direction D1 may have an angle of 60° with respect to the X-axis direction. Also, the third direction D2 may have an angle of 120° with respect to the X-axis direction.

As described above, an angle between the first direction X and the second direction D1 is identical to an angle between the second direction D1 and the third direction D2. Thus, the plurality of connection lines extended in the first direction X, the second direction D1 and the third direction D2 may be uniform in a stretch rate in all directions.

As shown in FIG. 6A and FIG. 6B, each of the first substrates 221 may have a hexagonal or a polygonal shape more than six sides or a circular shape.

For example, as shown in FIG. 6A, each first substrate 221 may have a circular shape. Also, a plurality of first connection lines 281, a plurality of second connection lines 282 and a plurality of third connection lines 283 may be connected to an outer circumferential surface of the first substrate 221.

As shown in FIG. 6B, each first substrate 221 may have an octagonal shape as another example of a hexagonal or a polygonal shape more than six sides. Also, a plurality of first connection lines 281, a plurality of second connection lines 282 and a plurality of third connection lines 283 may be connected to an outer circumferential surface of the first substrate 221.

Meanwhile, the plurality of first connection lines 281 and the plurality of second connection lines 282 may be disposed on the same layer. Also, the plurality of third connection lines 283 may be disposed on a different layer from the plurality of first connection lines 281 and the plurality of second connection lines 282. The plurality of third connection lines 283 may be disposed on a layer above the plurality of first connection lines 281 and the plurality of second connection lines 282.

As shown in FIG. 7, an upper insulating layer UI is disposed to cover at least a part of the connection pad PD, the first connection line 281, the second connection line 282 and the planarization layer 146. The upper insulating layer UI may be formed as an organic insulating layer like the planarization layer 146. More specifically, the upper insulating layer UI may be made of an acrylic-based organic material, but is not limited thereto.

Further, the third connection line 283 may be disposed on the upper insulating layer UI. Also, the bank 147 may be disposed to cover the third connection line 283. The third connection line 283 shown in FIG. 7 is illustrated as being independently disposed in the cross-sectional view, but is not limited thereto. The third connection line 283 may be connected to components of the switching transistor 150 and the driving transistor 160.

Further, on the first substrate 221, a first pixel PX1 including a plurality of first sub-pixels SPX1 and a second pixel PX2 including a plurality of second sub-pixels SPX2 may be disposed.

Furthermore, the plurality of first connection lines 281 is connected to the first pixel PX1 and the second pixel PX2. Only the plurality of second connection lines 282 may be connected to the first pixel PX1, and only the plurality of third connection lines 283 may be connected to the second pixel PX2. The plurality of first connection lines 281 and the plurality of second connection lines 282 may be connected to the first pixel PX1, and the plurality of first connection lines 281 and the plurality of third connection lines 283 may be connected to the second pixel PX2.

However, the present disclosure is not limited thereto. All the plurality of first connection lines 281, the plurality of second connection lines 282 and the plurality of third connection lines 283 may be connected to each of a plurality of first pixels PX1 and a plurality of second pixels PX2.

The plurality of first connection lines 281 may include a gate line, a high-potential power line and a low-potential power line. Also, each of the plurality of second connection lines 282 and the plurality of third connection lines 283 may be a data line. However, the present disclosure is not limited thereto. The plurality of first connection lines 281 may be used as light emitting lines depending on the structures of the sub-pixels SPX1 and SPX2. Also, each of the plurality of second connection lines 282 and the plurality of third connection lines 283 may be used as a reference voltage line, a sensing line, etc., depending on the structures of the sub-pixels SPX1 and SPX2.

A conventional display device uses a first substrate having a quadrangular shape. Thus, a stress is concentrated at edges of the quadrangular first substrate, which causes damage to a lower stretching substrate when the display device is repeatedly stretched.

However, in the display device 200 according to another embodiment of the present disclosure, the plurality of first substrates 221 may have a hexagonal or a polygonal shape more than six sides or a circular shape. Thus, a stress concentrated in an outer area of each first substrate 221 may be reduced. Accordingly, even when the display device 200 according to another embodiment of the present disclosure is repeatedly stretched, components such as a lower stretching substrate are not damaged. Thus, the stretching reliability of the display device 200 according to another embodiment of the present disclosure may be improved.

Further, in the conventional display device, a plurality of connection lines including first connection lines and second connection lines is vertically disposed, and the number and placement of connection lines are limited.

However, in the display device 200 according to another embodiment of the present disclosure, a plurality of connection lines includes the first connection lines 281, the second connection lines 282 and the third connection lines 283 which are disposed in diagonal directions. Thus, the display device 200 according to another embodiment of the present disclosure may include a greater number of connection lines. Therefore, it is possible to compensate for sub-pixels by using the additional connection lines. Also, in the display device 200 according to another embodiment of the present disclosure, the connection lines may be disposed in various ways. Thus, the display device 200 according to another embodiment of the present disclosure may be uniformly stretched in all directions.

Further, in the display device 200 according to another embodiment of the present disclosure, a first pixel and a second pixel are disposed on each first substrate 221. Thus, the number of pixels formed in a single rigid substrate may be increased. Therefore, the display device 200 may be improved in resolution and may also be increased in luminance.

Yet Another Embodiment of Present Disclosure

Hereinafter, a display device 300 according to yet another embodiment of the present disclosure will be described in detail. The display device according to yet another embodiment of the present disclosure is different from the display device 200 according to another embodiment of the present disclosure only in terms of a placement relationship between a plurality of connection lines. Accordingly, a detailed description of the same parts as those of the display device according to another embodiment of the present disclosure will be omitted, and the above-described difference will be described in detail.

Figure 8:
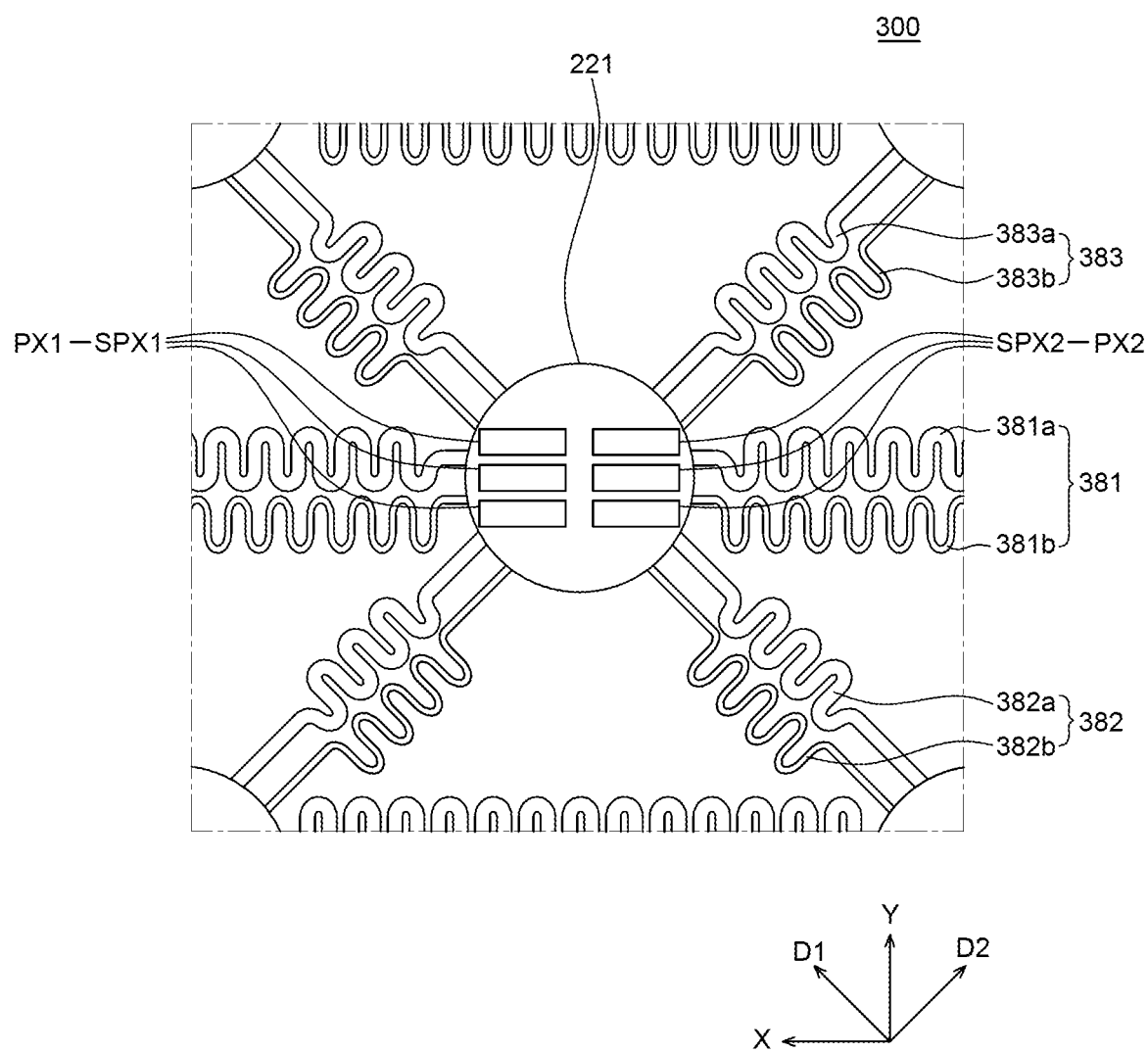
FIG. 8 is an enlarged plan view of an active area of a display device according to yet another embodiment of the present disclosure.

FIG. 8 is an enlarged plan view of an active area of a display device according to yet another embodiment of the present disclosure.

As shown in FIG. 8, a plurality of first connection lines 381 may include first main connection lines 381a and first sub-connection lines 381b. Also, a plurality of second connection lines 382 may include second main connection lines 382a and second sub-connection lines 382b. Further, a plurality of third connection lines 383 may include third main connection lines 383a and third sub-connection lines 383b.

Each first main connection line 381a may have a greater cross-sectional area than each first sub-connection line 381b. Also, each second main connection line 382a may have a greater cross-sectional area than each second sub-connection line 382b. Further, each third main connection line 383a may have a greater cross-sectional area than each third sub-connection line 383b.

For example, as shown in FIG. 8, each first main connection line 381a may have a greater thickness than each first sub-connection line 381b. Also, each second main connection line 382a may have a greater thickness than each second sub-connection line 382b. Further, each third main connection line 383a may have a greater thickness than each third sub-connection line 383b.

Thus, each first main connection line 381a may have a lower line resistance than each first sub-connection line 381b. Also, each second main connection line 382a may have a lower line resistance than each second sub-connection line 382b. Further, each third main connection line 383a may have a lower line resistance than each third sub-connection line 383b.

Therefore, each of the first main connection lines 381a, the second main connection lines 382a and the third main connection lines 383a may be applied with a high-potential power or a low-potential power having a relatively high voltage level. Also, each of the first sub-connection lines 381b, the second sub-connection lines 382b and the third sub-connection lines 383b may be applied with a gate voltage, a data voltage, a reference voltage and a sensing voltage having a relatively low voltage level.

As described above, the display device 300 according to yet another embodiment of the present disclosure may include the main connection lines 381a, 382a and 383a having a relatively high resistance and the sub-connection lines 381b, 382b and 383b having a relatively low resistance.

Thus, in the display device 300 according to yet another embodiment of the present disclosure, the main connection lines 381a, 382a and 383a and the sub-connection lines 381b, 382b and 383b are suitably disposed for voltage levels. Therefore, various levels of voltages may be supplied to a plurality of pixels.

Therefore, in the display device 300 according to yet another embodiment of the present disclosure, a pixel circuit may be configured in various forms.

The embodiments of the present disclosure can also be described as follows:

According to an aspect of the present disclosure, the display device includes a stretchable lower substrate and a plurality of first substrates disposed on the lower substrate and including a first pixel and a second pixel. The display device also includes a plurality of second substrates configured to connect first substrates adjacent to each other among the plurality of first substrates. The display device further includes a plurality of connection lines disposed on the plurality of second substrates and configured to connect the first pixel and the second pixel. The plurality of connection lines includes a plurality of first connection lines extended in a first direction, a plurality of second connection lines extended in a second direction and a plurality of third connection lines extended in a third direction. Thus, the display device may be improved in resolution and may be uniformly stretched in all directions.

Each of the plurality of first substrates may have a hexagonal or a polygonal shape more than six sides.

Each of the plurality of first substrates may have a circular shape.

An angle between the first direction and the second direction may be 60°, and an angle between the second direction and the third direction may be 60°, and an angle between the third direction and the first direction may be 60°.

Each of the first pixel and the second pixel may include a plurality of sub-pixels, and each of the plurality of sub-pixels includes a switching transistor, a driving transistor, a storage capacitor and a light emitting diode.

A drain electrode of the switching transistor may be connected to a gate electrode of the driving transistor.

The storage capacitor may include a gate electrode of the driving transistor, a first interlayer insulating layer disposed on the gate electrode of the driving transistor and an intermediate metal layer disposed on the first interlayer insulating layer.

The plurality of first connection lines and the plurality of second connection lines may be disposed on the same layer, and the plurality of third connection lines may be disposed on a different layer from the plurality of first connection lines and the plurality of second connection lines.

The plurality of first connection lines may include first main connection lines and first sub-connection lines.

The plurality of second connection lines may include second main connection lines and second sub-connection lines.

The plurality of third connection lines may include third main connection lines and third sub-connection lines.

A line resistance of the first main connection lines may be lower than a line resistance of the first sub-connection lines.

A line resistance of the second main connection lines may be lower than a line resistance of the second sub-connection lines.

A line resistance of the third main connection lines may be lower than a line resistance of the third sub-connection lines.

At least one of the first main connection lines, the second main connection lines and the third main connection lines may be applied with a high-potential power or a low-potential power.

At least one of the first sub-connection lines, the second sub-connection lines and the third sub-connection lines may be applied with a gate voltage or a data voltage.

According to another aspect of the present disclosure, the display device includes a ductile substrate and a plurality of rigid substrates disposed on the ductile substrate. The display device also includes a plurality of pixels formed on each of the plurality of rigid substrates, and a plurality of connection lines disposed between the plurality of rigid substrates and connected to the plurality of pixels. The plurality of connection lines may be extended in at least three directions.

Each of the plurality of rigid substrates may have a polygonal shape having edges greater in number than the extension directions of the plurality of connection lines.

When angles between the plurality of connection lines may be all the same.

Any one of the plurality of connection lines may be disposed on a different layer from another one of the plurality of connection lines.

Any one of the plurality of connection lines may have a different line resistance from another one of the plurality of connection lines.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a stretchable lower substrate;
   a plurality of first substrates disposed on the stretchable lower substrate and including a first pixel and a second pixel;
   a plurality of second substrates configured to couple first substrates adjacent to each other among the plurality of first substrates;
   a plurality of connection lines disposed on the plurality of second substrates, configured to couple the first pixel and the second pixel and including a metal material,
   the plurality of connection lines including a plurality of first connection lines extended in a first direction and electrically connecting at least one of the first pixel and the second pixel of the first substrates adjacent to each other in the first direction, a plurality of second connection lines extended in a second direction and electrically connecting at least one of the first pixel and the second pixel of the first substrates adjacent to each other in the second direction, and a plurality of third connection lines extended in a third direction and electrically connecting at least one of the first pixel and the second pixel of the first substrates adjacent to each other in the third direction; and
   an upper insulating layer disposed between a first layer where the plurality of first connection lines and the plurality of second connection lines are disposed and a second layer where the plurality of third connection lines,
   wherein the plurality of first connection lines and the plurality of second connection lines are disposed on a same layer,
   wherein the plurality of third connection lines is disposed on a different layer from the plurality of first connection lines and the plurality of second connection lines,
   wherein the plurality of first connection lines and the plurality of second connection lines contact a bottom surface of the upper insulating layer, and
   wherein the plurality of third connection lines contacts a top surface of the upper insulating layer.

2. The display device according to claim 1, wherein each of the plurality of first substrates has either a hexagonal shape or a polygonal shape more than six sides.

3. The display device according to claim 1, wherein each of the plurality of first substrates has a circular shape.

4. The display device according to claim 1,
   wherein an angle between the first direction and the second direction is 60°, and
   wherein an angle between the second direction and the third direction is 60°, and
   wherein an angle between the third direction and the first direction is 60°.

5. The display device according to claim 1,
   wherein each of the first pixel and the second pixel includes a plurality of sub-pixels, and
   wherein each of the plurality of sub-pixels includes a switching transistor, a driving transistor, a storage capacitor, and a light emitting diode.

6. The display device according to claim 5, wherein a drain electrode of the switching transistor is coupled to a gate electrode of the driving transistor.

7. The display device according to claim 5,
   wherein the storage capacitor includes:
   a gate electrode of the driving transistor;
   a first interlayer insulating layer disposed on the gate electrode of the driving transistor; and
   an intermediate metal layer disposed on the first interlayer insulating layer.

8. The display device according to claim 1,
   wherein the plurality of first connection lines includes first main connection lines and first sub-connection lines,
   wherein the plurality of second connection lines includes second main connection lines and second sub-connection lines,
   wherein the plurality of third connection lines includes third main connection lines and third sub-connection lines,
   wherein a line resistance of the first main connection lines is lower than a line resistance of the first sub-connection lines,
   wherein a line resistance of the second main connection lines is lower than a line resistance of the second sub-connection lines, and
   wherein a line resistance of the third main connection lines is lower than a line resistance of the third sub-connection lines.

9. The display device according to claim 8,
   wherein at least one of the first main connection lines, the second main connection lines and the third main connection lines is applied with a high-potential power or a low-potential power, and
   wherein at least one of the first sub-connection lines, the second sub-connection lines and the third sub-connection lines is applied with a gate voltage or a data voltage.

10. The display device according to claim 1, wherein the lower substrate has an active area and a non-active area adjacent to the active area, and the plurality of first substrates are disposed in the active area of the lower substrate.

11. The display device according to claim 10, further comprising a plurality of third substrates disposed in the non-active area of the lower substrate, and a gate driver and a plurality of pads are formed on the plurality of third substrates.

12. A display device, comprising:
a ductile substrate;
a plurality of rigid substrates disposed on the ductile substrate and including a first pixel and a second pixel;
a plurality of pixels formed on each of the plurality of rigid substrates;
an upper insulating layer; and
a plurality of connection lines disposed between the plurality of rigid substrates, and coupled to the plurality of pixels and including a metal material,
wherein the plurality of connection lines is extended in at least three directions,
wherein at least one of the plurality of connection lines is disposed on a different layer from another one of the plurality of connection lines,
wherein the upper insulating layer is disposed between the at least one of the plurality of connection lines and the another one of the plurality of connection lines,
wherein the at least one of the plurality of connection lines contacts a bottom surface of the upper insulating layer,
wherein the another one of the plurality of connection lines contacts a top surface of the upper insulating layer, and
wherein the plurality of connection lines including a plurality of first connection lines extended in a first direction and electrically connecting at least one of the first pixel and the second pixel of the rigid substrates adjacent to each other in the first direction, a plurality of second connection lines extended in a second direction and electrically connecting at least one of the first pixel and the second pixel of the rigid substrates adjacent to each other in the second direction, and a plurality of third connection lines extended in a third direction and electrically connecting at least one of the first pixel and the second pixel of the rigid substrates adjacent to each other in the third direction.

13. The display device according to claim 12, wherein each of the plurality of rigid substrates has a polygonal shape having edges greater in number than the extension directions of the plurality of connection lines.

14. The display device according to claim 12, wherein angles between the plurality of connection lines are all the same.

15. The display device according to claim 12, wherein any one of the plurality of connection lines has a different line resistance from another one of the plurality of connection lines.

16. The display device according to claim 12, wherein the ductile substrate has a ductile breaking rate of 100% or more,
wherein the ductile breaking rate is defined as a ratio between an extension distance and an original length of an object, and
wherein the extension distance refers to a distance at which the object either breaks or cracks when it is stretched.

* * * * *